(12) United States Patent
Arques (10) Patent No.: US 9,234,969 B2
(45) Date of Patent: Jan. 12, 2016

(54) RADIATION DETECTOR COMPRISING A CIRCUIT FOR INJECTING A CALIBRATED QUANTITY OF COUNTER-CHARGES (75) Inventor: Marc Arques, Grenoble (FR)

(73) Assignees: Commissariat A L'Energie Atomique et aux Energies Alternatives, Paris (FR); Trixell Z.I., Moirans (FR)

(*) Notice: Subject to any disclaimer, the term of this patent is extended or adjusted under 35 U.S.C. 154(b) by 0 days.

(21) Appl. No.: 14/129,232

(22) PCT Filed: Jun. 25, 2012

(86) PCT No.: PCT/EP2012/062189
§ 371 (c)(1),
(2), (4) Date: Aug. 6, 2014

(87) PCT Pub. No.: WO2013/000849
PCT Pub. Date: Jan. 3, 2013

(65) Prior Publication Data
US 2015/0034832 A1 Feb. 5, 2015

(30) Foreign Application Priority Data
Jun. 30, 2011 (FR) .................................. 11 02062

(51) Int. Cl.
H01L 27/146 (2006.01)
G01T 7/00 (2006.01)
G01T 1/24 (2006.01)
G01T 1/18 (2006.01)

(52) U.S. Cl.
CPC . *G01T 7/005* (2013.01); *G01T 1/18* (2013.01); *G01T 1/24* (2013.01); *G01T 1/247* (2013.01); *H01L 27/146* (2013.01); *H01L 27/14612* (2013.01)

(58) Field of Classification Search
CPC .......................... G01T 1/2928; H01L 27/14612
See application file for complete search history.

(56) References Cited

U.S. PATENT DOCUMENTS

2010/0051823 A1* 3/2010 Brenner et al. ............... 250/389

FOREIGN PATENT DOCUMENTS

EP 1959673 A1 8/2008

OTHER PUBLICATIONS

Arnaud Peizerat et al., "Auto-Adaptive LSB Technique for In-Pixel Analog to Digital Conversion," Proceedings of SPIE, vol. 6816, Jan. 1, 2008, pp. 68160S-1-68160S-11, XP055022016.
Arnaud Peizerat et al., "Pixel-Level A/D Conversion: Comparison of Two Charge Packets Counting Techniques," Proceedings of 2007 International Image Sensor Workshop, Jun. 7, 2007, pp. 200-203, XP002671647.

* cited by examiner

Primary Examiner — David Porta
Assistant Examiner — Hugh H Maupin
(74) Attorney, Agent, or Firm — Baker Hostetler LLP (57) ABSTRACT An electronic read circuit for a radiation detector comprises: a comparator receiving a threshold potential and the potential from an integration node, said node being able to store electrical charges that are generated by a photosensitive element; a counter connected to the output of the comparator; and a counter-charge injection circuit comprising: a capacitor that stores counter-charges, a transfer transistor that can be turned on in order to transfer counter-charges from a terminal of the capacitor to the integration node whenever the comparator toggles, the transfer of the counter-charges bringing about a variation of potential at said terminal of the capacitor, and a regulation circuit for controlling the transfer transistor, said circuit comprising means for turning on the transfer transistor when the potential of the terminal of the capacitor is between two predetermined potentials that are independent of the transfer transistor.

11 Claims, 8 Drawing Sheets

RADIATION DETECTOR COMPRISING A CIRCUIT FOR INJECTING A CALIBRATED QUANTITY OF COUNTER-CHARGES

CROSS-REFERENCE TO RELATED APPLICATIONS

This application is a National Stage of International patent application PCT/EP2012/062189, filed on Jun. 25, 2012, which claims priority to foreign French patent application No. FR 1102062, filed on Jun. 30, 2011, the disclosures of which are incorporated by reference in their entirety.

FIELD OF THE INVENTION

The invention concerns an electronic circuit for a radiation detector that is capable of quantifying radiation photons that are received by a counter-charge injection circuit. It concerns particularly array radiation detectors that are intended for X-ray or gamma-ray imaging, comprising an array of CMOS-technology pixels that is associated with a structure for converting X-rays or gamma rays into electrical charges.

BACKGROUND

An array radiation detector comprises an array of pixels and an electronic circuit forming a read means. Each pixel comprises a photosensitive element that generates electrical charges in proportion to the received quantity of photons. These electrical charges, which are also called photocharges, are processed by the read means in order to provide a piece of information that is representative of the quantity of photons that is received by each photosensitive element. The use of CMOS technology has allowed the read means to be integrated at each pixel. Thus, the electrical charges can be converted into digital signals actually inside the pixels in order to facilitate transfer of the result of the detection to the outside of the array. A common solution for producing the read means is to use a circuit that operates by integrating the electrical charges. This integration circuit comprises an integration capacitance receiving the charges from the photosensitive element, a threshold comparator, a counter and a counter-charge injection circuit. During an exposure phase, the arrival of electrical charges on the integration capacitance brings about a decrease in the voltage at the terminals thereof. During a phase of reading the electrical charges, the threshold comparator toggles a certain number of times, as long as the voltage at the terminals at the integration capacitance is below a threshold voltage. Each toggling of the comparator increments the counter by one unit and prompts the injection circuit to inject a packet of counter-charges, the quantity—Q0 of which is calibrated. The minus sign is used arbitrarily in order to indicate that the injected counter-charges have a polarity that is opposite that of the charges received from the photosensitive element. The counter is thus incremented by the number of charge packets that is necessary in order to bring back a voltage that is higher than the threshold voltage at the terminals of the integration capacitance. In practice, counter-charges are generally injected as photocharges are collected, with a counter determining the number of times the comparator toggles, in order to estimate the total quantity of charges that is injected. The reading then corresponds to the reading of the content of the counters. The number of incrementations of the counter provides a numerical value that is representative of the quantity of photons that is received by the photosensitive element.

The counter-charge injection circuit is a critical element in the integration circuit. This is because the precision of the measurement rests on the calibration of the quantity—Q0 of counter-charges. Firstly, the quantity—Q0 of counter-charges must be relatively small since it corresponds to the pace of the quantification of the charges; secondly, this quantity must be identical for each packet of counter-charges since it quantifies the charges received by the integration capacitance.

In counter-charge injection circuits today, however, the quantity of charges that is injected whenever the comparator toggles can fluctuate. The reason is that these circuits have field-effect transistors, the channels of which are affected by random noise that is referred to as its "Random Telegraph Signal". The random nature of this noise has an influence on the quantity of counter-charges that is injected: some injections are affected by this noise, but others are not. Therefore, when wishing to estimate the total charge injected by a certain number of injections, the injections that have or have not been affected are not known.

By way of example, a counter-charge injection circuit frequently comprises two field-effect transistors (FET) connected in series and a capacitor connected between the connection point for the transistors and a fixed voltage, for example ground. A first transistor allows the capacitor to be charged to a first voltage value, referred to as charging voltage, which is controlled by the gate voltage for this transistor. The second transistor allows the capacitor to be discharged to a second voltage value, referred to as discharge voltage, which is controlled by the gate voltage of this transistor. The quantity—Q0 of counter-charges that are injected from the capacitor to the integration capacitance of the integration circuit is based on the value of the capacitance of the capacitor and on the difference between the charging and discharge voltages. However, the charging and discharge voltages cannot be deduced directly from the gate voltages of the transistors. The charging and discharge voltages correspond to the internal potentials of the transistors, which are not known precisely on account of the rts noise caused by the entrapment of charges in the channel of each transistor. This rts noise is all the more significant because the components have small dimensions in order to generate relatively small quantities—Q0 of counter-charges. In practice, this rts noise modifies the value of the quantity—Q0 by a few percent. This modification has direct repercussions on the evaluation of the quantity of photons that is received, and therefore the quality of the image obtained. Such an error is generally unacceptable in detectors, particularly in the field of medical imaging.

SUMMARY OF THE INVENTION

An aim of the invention is notably to overcome all or some of the aforementioned disadvantages by precisely determining the quantity of counter-charges that are injected in order to evaluate the quantity of charges that are generated by a photosensitive element. To this end, the invention relates to an electronic circuit for a radiation detector having:

a comparator, a first input of which receives a predetermined threshold potential and a second input of which is capable of being connected to an integration node that can store electrical charges generated by a photosensitive element upon reception of a photon radiation, the charges bringing about a variation in a detection potential on the integration node, a counter connected to the output of the comparator, so as to count transgressions of the threshold potential by the detection potential, and a counter-charge injection circuit allowing the charges to be counterbalanced, said circuit comprising:

a capacitor storing electrical counter-charges, a transfer transistor that can be turned on in order to transfer counter-charges from a terminal of the capacitor to the integration node whenever the comparator toggles, said terminal of the capacitor forming a node of the injection circuit, the transfer of the counter-charges bringing about a variation in a potential at said node of the injection circuit, and a regulation circuit for controlling the transfer transistor, said circuit comprising means for turning on the transfer transistor when the potential at the node of the injection circuit is between two predetermined potentials that are independent of the transfer transistor.

Such a circuit exercises control over the quantity of charges that is injected whenever the comparator toggles. The total quantity of the charge collected by the detector is then improved, which increases the precision of the measurement.

According to a preferred embodiment, the regulation circuit comprises, moreover, means for generating a reference potential at a point at which the variation is representative of a variation in the potential at the node of the injection circuit, the means for controlling the transfer transistor turning on the latter when the reference potential is between two predetermined potentials that are independent of the transfer transistor.

The invention likewise concerns a radiation detector having a photosensitive element that generates electrical charges on the integration node upon reception of a photon radiation, as described previously, the second input of the comparator being connected to the integration node.

The invention notably has the advantage of allowing the use of components of small dimensions while getting rid of the rts noise. The quantity—Q0 of counter-charges that are injected may be very small, thus leading to precise quantification of the charges generated by each photosensitive element. Moreover, the use of components of small dimensions allows the surface area occupied by the counter-charge injection circuit in each pixel to be limited. The invention thus makes it possible to resort to these compact components without degrading the precision of the measurement. Compact components are understood to mean components in which the greatest length is in the order of one micron, or less.

BRIEF DESCRIPTION OF THE DRAWINGS

The invention will be better understood, and other advantages will emerge, upon reading the description that follows, which is given with reference to the appended drawings, in which.

DETAILED DESCRIPTION

Figure 1:
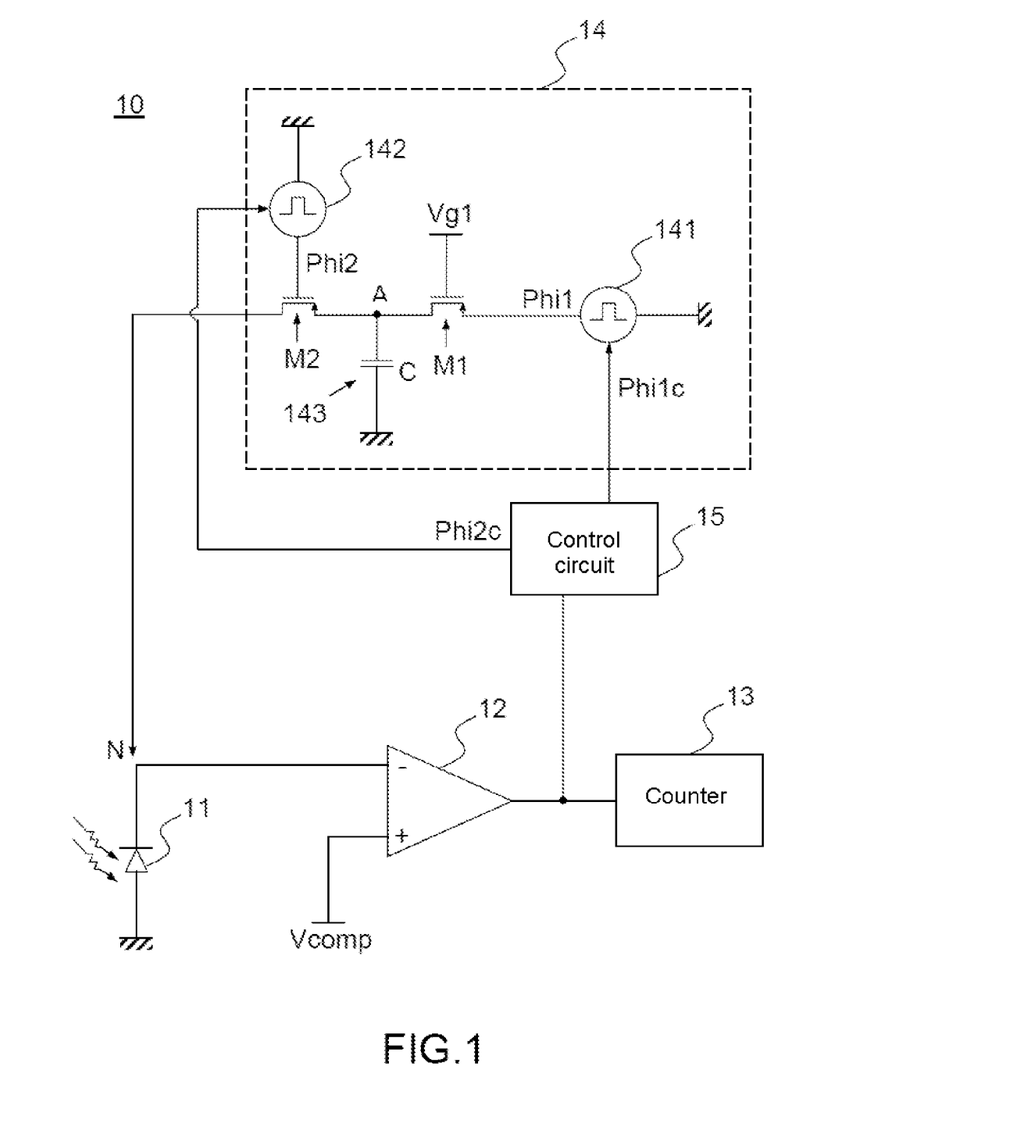
FIG. 1 shows the circuit diagram for a pixel in a radiation detector according to the prior art.

FIG. 1 shows the circuit diagram for a pixel 10 in an array radiation detector according to the prior art. Each pixel 10 forms a photosensitive point in the array detector. It comprises a photodiode 11, a threshold comparator 12, a counter 13 and a counter-charge injection circuit 14. The threshold comparator 12, the counter 13 and the injection circuit 14 form an electronic circuit that allows the photodiode 11 to be read. The photodiode 11 could be replaced by a phototransistor or, more generally, by any photosensitive element that generates electrical charges in proportion to the quantity of photons that it receives. By way of example, the photons under consideration have a wavelength in the visible domain or in the x-ray domain. In the latter case, either the photosensitive element produces electrical charges directly under the effect of x-ray radiation or it is sensitive to visible radiation, in which case a scintillator is interposed between the x-ray source and the photosensitive element.

The photodiode 11 has a parasitic capacitance that is used as an integration capacitance for storing the electrical charges generated during an exposure phase. The parasitic capacitance of the photodiode is generally sufficient. Nevertheless, a capacitor could be connected in parallel with the photodiode in order to increase the integration capacitance. The anode of the photodiode 11 receives a fixed voltage. By way of example, it is connected to the electrical ground. The threshold comparator 12 receives a threshold voltage Vcomp on a positive input. The negative input is connected to the cathode of the photodiode 11. An output of the comparator 12 is connected to an input of the counter 13.

The counter-charge injection circuit 14 comprises two field-effect transistors (FET): a first transistor M1 and a second transistor M2, two voltage sources 141 and 142 and a capacitor 143 of capacitance C. The drain of the first transistor M1, the source of the second transistor M2 and a terminal of the capacitor 143 are connected at a point A, called the node of the counter-charge injection circuit.

The first transistor M1 has its source connected to the voltage source 141 and has its drain connected to the source of the second transistor M2. The first transistor M1 allows a charge to be set up at the node of the charge injection circuit. It will be called a precharge transistor. The connection point between the transistors M1 and M2 corresponds to the point A defined above.

The drain of the second transistor M2 is connected to the cathode of the photodiode 11, so as to be able to inject counter-charges therein. Therefore, the second transistor M2 can be called a transfer transistor. Let it be stated that the cathode of the photodiode 11 likewise corresponds to the point at which there is an accumulation of charges generated by the interactions of the radiation in the detector. This point can be called an integration node N for the pixel. In other words, the node N is a connection point between the photodiode 11 and the electronic read circuit thereof. It can receive firstly electrical charges from the photodiode 11 when the latter is exposed and secondly electrical counter-charges from the counter-charge injection circuit 14.

The collection of electrical charges and the injection of counter-charges on the node N bring about a variation in the potential of the latter. By way of example, it can be considered that, during the reception of photons, the photodiode 11 generates negative charges (electrons) that are stored on the cathode thereof. These negative charges bring about a decrease in the potential of the node N. When the potential becomes lower than the threshold potential Vcomp, the comparator 12 toggles. Each toggling is counted by the counter 13. The gate of the transistor M1 is biased to a fixed potential Vg1. The gate of the transistor M2 is biased by the voltage source 142. The capacitor 143 is connected between the point A and a fixed voltage source, for example ground. The voltage sources 141 and 142 deliver potentials Phi1 and Phi2, respectively. They are controlled by a control circuit 15 that receives at its input a piece of toggling information from the threshold comparator 12, and that delivers at its output a first signal Phi1c that controls the voltage source 141 and a second signal Phi2c that controls the voltage source 142. The counter-charge injection circuit 14 may not have a capacitor 143, in which case the capacitance C is provided by the parasitic capacitances of the transistors M1 and M2.

Figure 2A:
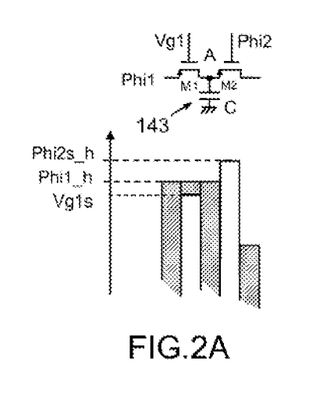
FIGS. 2A to 2E illustrate the principle of operation of a counter-charge injection circuit in the pixel from FIG. 1.
Figure 2B:
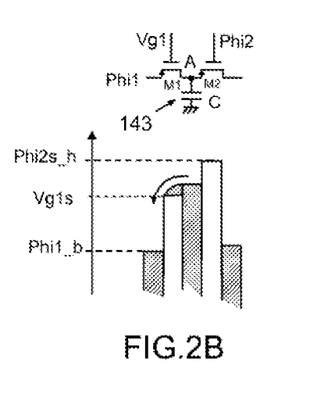
Figure 2C:
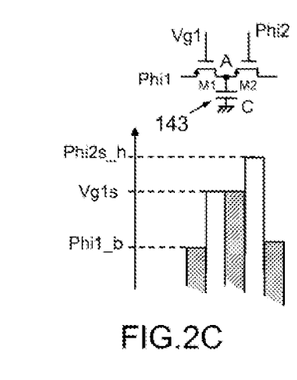
Figure 2D:
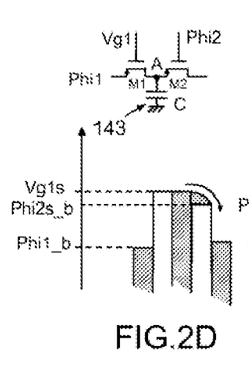
Figure 2E:
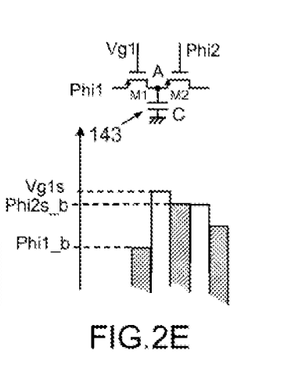

FIGS. 2A to 2E illustrate the principle of operation of the counter-charge injection circuit 14 in accordance with a hydraulic model that is conventional in the field of charge coupled circuits (CCD). In these figures, the transistors M1 and M2 are considered to be subject to heavy reverse bias. The transistors M1 and M2 could just as easily operate under light reverse bias. The quantitative values would be modified therefor, but the qualitative explanations given below continue to be valid. In each of these figures, the columns, from left to right, represent the potential Phi1, the internal potential Vg1s of the transistor M1, the potential Va at the point A, the internal potential Phi2s of the transistor M2 and the drain potential Vd2 of the transistor M2. The attention of the reader is drawn to the fact that it is the internal potentials of the transistors M1 and M2 that are under consideration, that is to say the potentials of the channels, rather than the potentials applied to the gates. The first-order approximation of the internal potential of the gate of a transistor is Vg-VT, where Vg is the potential applied to the gate of the transistor and VT is the threshold voltage of the transistor. The injection of counter-charges to the photodiode 11 requires the succession of a precharge step, a skimming step and a transfer step. By way of example, the injection of counter-charges is triggered by the toggling of the comparator 12. FIG. 2A shows the counter-charge injection circuit 14 during the precharge step. In this step, the potential Phi1 is at a high level Phi1_h. The potential Phi2 is at a high level Phi2_h. The internal potential Phi2s is therefore at a high level Phi2s_h. The potentials Phi1_h, Vg1 and Phi2_h are determined so that the potential Phi1_h is higher than the potential Vg1s and lower than the potential Phi2s_h. The potential Va can thus be stabilized to the potential Phi1_h. FIG. 2B shows the injection circuit 14 during the skimming step. During this step, the potential Phi1 is at a low level Phi1_b, which is lower than the potential Vg1s. The potential Phi2s is maintained at its high level Phi2s_h. The transistor M1 is on and evacuates the excess charges from the capacitor 143 to the voltage source 141, bringing about a decrease in the potential Va. FIG. 2C shows the injection circuit 14 at the end of the skimming step. In this figure, it appears that the potential Va has stabilized at the potential Vg1s. During the transfer step, shown by FIG. 2D, the potential Phi2 is maintained at a low level Phi2_b. The internal potential Phi2s is therefore at a low level Phi2s_b. The potential Phi2_b is determined so that the potential Phi2s_b is lower than the potential Vg1s. The transistor M2 is on and evacuates the excess charges in the capacitor 143 to the photodiode 11. The transfer of the charges brings about a decrease in the potential Va and an increase in the potential on the node N. FIG. 2E shows the injection circuit 14 at the end of this transfer step. The potential Va has stabilized at the potential Phi2s_b. The step of transferring the excess charges (counter-charges) to the photodiode 11 has thus allowed the potential Va to be decreased from Vg1s to Phi2s_b. The quantity—Q0 of counter-charges that are injected on the photodiode 11 is therefore C×(Vg1s−Phi2s_b). For the following injection of counter-charges, the precharge, skimming and transfer steps are repeated. Injections are carried out until the potential on the node N reaches the threshold potential Vcomp. It should be noted that the capacitance of the photodiode 11 may be sufficiently low for the injection of a single counter-charge to take the potential of the node N to the threshold potential Vcomp, which brings about toggling of the comparator 12.

Figure 3A:
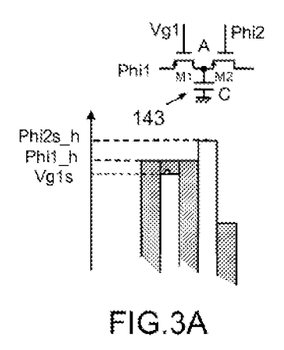
FIGS. 3A to 3E illustrate—by means of a representation similar to FIGS. 2A to 2E—the impact of rts noise on the operation of the counter-charge injection circuit from FIG. 1.
Figure 3B:
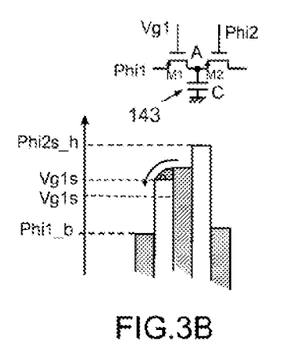
Figure 3C:
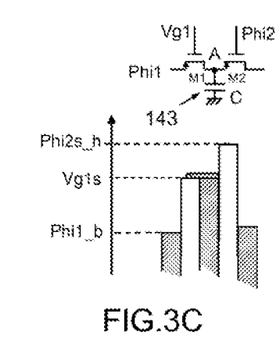
Figure 3D:
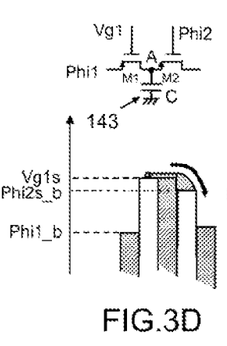
Figure 3E:
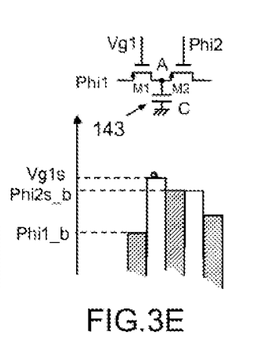

In the aim of injecting a limited quantity of counter-charges, the transistors M1 and M2 need to be controlled by low potentials and the capacitance C of the capacitor 143 needs to be minimal. Therefore, the dimensions of the transistors need to be relatively small. The FET transistors then see the appearance of significant rts noise, which is particularly disturbing because it is random. This rts noise is due to the entrapment of one or more charges in one or more traps in the channel of the transistor. The length of time for which charges are trapped is typically in the order of one second. For the whole of this time, the operation of the FET transistor is modified. This modification can be seen as a variation in conduction of the transistor, or as a variation in the potential of the channel of the transistor for the same potential on the gate. FIGS. 3A to 3E illustrate the impact of rts noise on the operation of the counter-charge injection circuit 14 from FIG. 1. FIGS. 3A to 3E are equivalent to FIGS. 2A to 2E, respectively, in the case in which a hole is trapped in the channel of the transistor M1. This trapped positive charge increases the potential Vg1s in the channel. It is shown in FIGS. 3A to 3E by a hump, by analogy with a pebble placed on the bottom of a water way. This hump produces very little disturbance for the precharge step, which is shown in FIG. 3A. The potential Va likewise stabilizes at the potential Phi1_h. On the other hand, the trapped charge slows down the skimming step, which is shown in FIG. 3B, and, especially, modifies the level at which the potential Va stabilizes. At the end of the skimming step, which is shown in FIG. 3C, the potential Va is slightly higher than the potential Vg1s. During the transfer step, which is shown in FIG. 3D, a greater quantity of charges is therefore injected onto the photodiode 11. It is noted that even if the trapped charge does not modify the potential of the channel over the entire width thereof, it inevitably slows down the skimming stage. The durations attributed to each step are still limited in practice, however. In other words, the trapping of a charge inevitably translates into a modification of the potential Va. Similarly, a hole could be trapped in the channel of the transistor M2, modifying the level of stabilization of the potential Va at the end of the transfer step. In summary, rts noise involves a variation in the quantity—Q0 of counter-charges that are injected. The variation in this quantity—Q0 is typically in the order of several percent, which may prove unacceptable in some imaging fields, notably medical imaging.

Thus, in a general manner, the noise referred to as rts affects, randomly, the potential in the channels of the transistors of the counter-charge injection circuit. Therefore, during each injection of the counter-charges, the quantity of charges that is injected can fluctuate in an uncontrolled manner.

The invention aims to get rid of rts noise in the FET transistors and to allow the injection of a constant quantity of counter-charges. To this end, the counter-charge injection circuit according to the invention comprises means for controlling the transfer transistor M2 such that, during the transfer step, the variation in voltage at the node A of the injection circuit is equal to a variation between two predetermined potentials that are independent of the transistor M2, that is to say that are independent of the potential of the channel thereof. Moreover, the variation in voltage at the node A of the injection circuit is independent of the potential of the channel of the precharge transistor M1.

Figure 4:
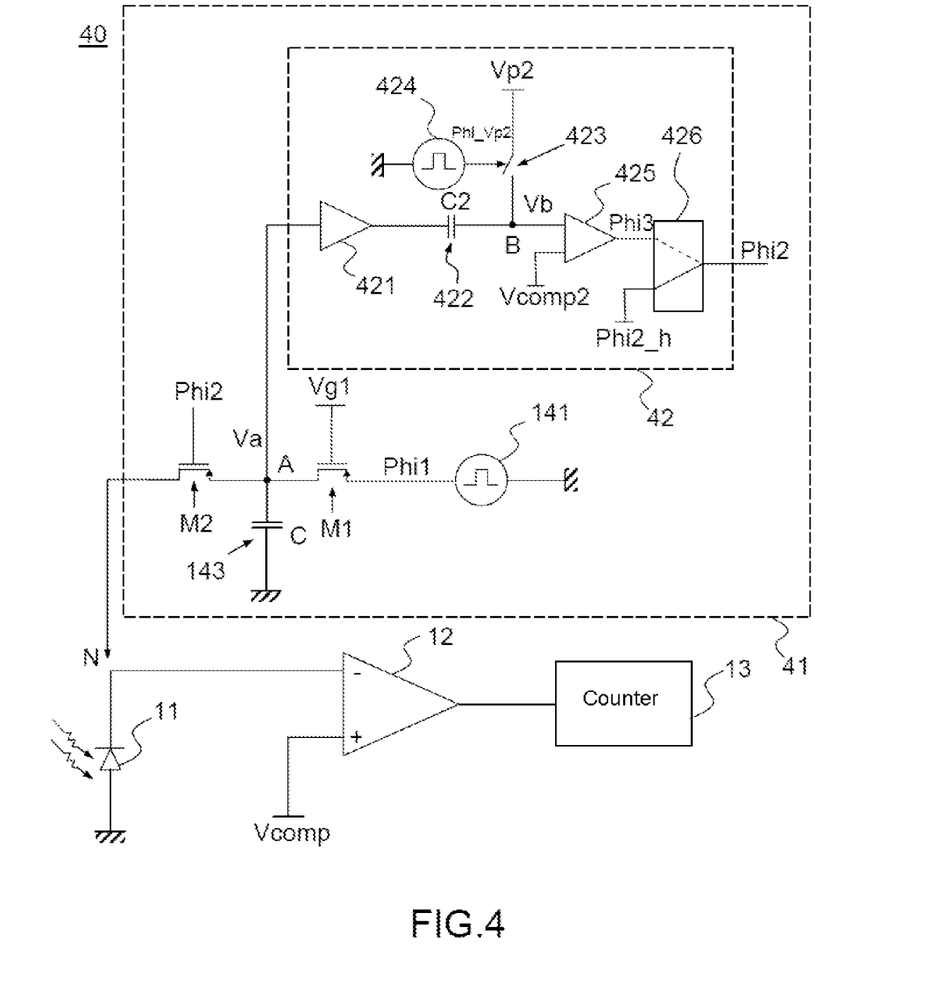
FIG. 4 shows the circuit diagram for a first example of a pixel according to the invention.

FIG. 4 shows the circuit diagram for a first example of a pixel 40 according to the invention. The electronic circuit for reading the pixel 40 differs from the electronic circuit for reading the pixel 10 in FIG. 1 only by virtue of the counter-charge injection circuit. Said circuit 41 likewise comprises two FET transistors M1 and M2 connected in series, a voltage source 141 and a capacitor 143 of capacitance C, typically from a few fF to a few tens of fF. This capacitance C can be called counter-charge capacitance, because it is involved in the creation of a counter-charge at the node A of the counter-charge injection circuit 41. Said circuit 41 moreover has a regulation circuit 42. The transistor M1 has its source connected to the voltage source 141 and has its drain connected to the point A. The transistor M2 has its source connected to the point A and has its drain connected to the node N, that is to say to the cathode of the photodiode 11. The capacitor 143 is connected between the point A and a fixed voltage source, in this case ground. The gate of the transistor M1 is still biased to a fixed potential Vg1. On the other hand, the gate of the transistor M2 is biased by a control potential Phi2 that is generated by the regulation circuit 42. The regulation circuit 42 receives the potential Va from the point A at its input and controls the control potential Phi2 on the basis of the variation in this potential. It comprises a follower 421, a capacitor 422 of capacitance C2, a controlled switch 423, a voltage source 424 driving the controlled switch 423, a threshold comparator 425, a switch 426 and voltage sources delivering a fixed potential Vp2, a fixed potential Vcomp2 and a fixed potential Phi2_h. An input of the follower 421 is connected to the point A. An output of the follower 421 is connected to a first plate of the capacitor 422, a second plate being connected to a point B, the potential of which forms a reference potential Vb, which potential can be described as an imaging potential for the potential at the point A (node of the injection circuit). The follower 421 and the capacitor 422 form means for generating a reference potential Vb, the variation of which is representative of the variation in the potential Va. The point B is moreover connected to a negative input of the comparator 425 and to the switch 423. The voltage source 424 controls the switch 423 by means of control pulses Phi_Vp2, so as to apply a potential Vp2 to the point B. A positive input of the comparator 425 receives a fixed potential Vcomp2, which is lower than the potential Vp2. An output of the comparator 425 delivers the control potential Phi3. This potential can take two values Phi3_h and Phi3_b, depending on the result of the comparison between the potential Vb at the point B and the potential Vcomp2. A switch 426, which is positioned downstream of the comparator 425, allows the output Phi3 of the comparator to be connected to the control Phi2 of the transistor M2 during the transfer phase, this phase being triggered at a predetermined instant after the toggling of the comparator 12. Naturally, Phi3_h and Phi3_b correspond to Phi2_h and Phi2_b, respectively. Thus, during the transfer phase, the output of the comparator 425 forms a means for controlling the transistor M2. Means for regulating the values Phi2_h and Phi2_b, which are not shown, are provided in order to be able to adjust the bias of the transistor M2. These regulating means may be integrated in the comparator 425, or inserted between the comparator 425 and the gate of the transistor M2. The voltage sources 141 and 424 and the switch 426 can be controlled by a control circuit, not shown, that receives at its input a piece of toggling information from the threshold comparator 12.

Outside the transfer phase, the switch 426 allows the control Phi2 to be connected at its high level Phi2_h, independently of the output Phi3.

The counter-charge injection circuit 41 operates in the following manner: during the precharge step, for example triggered by the control circuit following the toggling of the comparator 12, at the time $t_0$, the potential Phi1 is at the high level Phi1_h and the internal potential Phi2s is at the high level Phi2_h, with Phi1_h being higher than Vg1s and lower than Phi2s_h. In the course of this step, the potential Phi_Vp2 is brought to its high level, so as to turn on the switch 423. This allows the potential of B to be fixed independently of the potential of A. The output Phi3 of the comparator 425 is at its low level Phi3_b. The gate potential Phi2, controlling the transistor M2, is at its high level Phi2_h. This step lasts for a predetermined duration, between $t_0$ (or $t_0+\epsilon$) and $t_1$. The potential of A is then Phi1_h.

The skimming step involves an adjustment of the charge generated at the node A of the charge injection circuit. This step is triggered at an instant $t_1$, which is predetermined, following the toggling of the comparator 12. The potential Phi1 is taken to the low level Phi1_b, which is lower than the potential Vg1s. At the end of the skimming step, the potential Va is therefore at the level Vg1s plus a possible variation due to rts noise in the transistor M1. In the course of this step, the potential Phi_Vp2 is maintained at its high level, which turns on the switch 423, so as to fix the potential of B independently of the potential of A, and therefore of the rts noise. The output of the comparator Phi53 is at its low level Phi3_b. The potential Phi2, controlling the transistor M2, is at its high level Phi2_h. This step lasts for a predetermined duration, between $t_1$ (or $t_1+\epsilon$) and $t_2$.

The end of the skimming occurs at an instant $t_2$, the time difference between $t_2$ and $t_0$ being predetermined. At this instant, the potential Phi_Vp2 toggles to its low level, which opens the switch 423.

The third step corresponds to the charge transfer. This step takes place from an instant $t_3$, the time difference between $t_0$ and $t_3$ being predetermined. In the course of this step, the potential Phi_Vp2 is maintained at its low level, which opens the switch 423 so that the potential of B follows the development of the potential of the node A of the injection circuit 41 via the follower 421 and the associated capacitance C2. Moreover, the gate voltage Phi2 of the transfer transistor M2 is made equal to the output voltage Phi3. The output Phi3 of the comparator 425 is then at its low level Phi3_b. The gate potential Phi2, controlling the transistor M2, is at its low level Phi2_b.

The application of Phi2_b to the gate of the transistor M2 triggers the transfer of counter-charges from the point A to the node N. As the counter-charges are injected onto the node N, the potential Va decreases. This decrease is transmitted, via the follower 421 and the capacitor 422, to the point B. The point B and its potential Vb can thus be described, vis-à-vis the point A, as an image point for the point A and as an image potential for the potential Va, respectively, because when the switch 423 is open, which is the case during the transfer of charges, the potential Vb decreases following the development of the potential of the point A. The potential Vb decreases until it reaches the potential Vcomp2. The comparator 425 then toggles, and its output Phi3 toggles to its high level Phi3_h. Thus, Phi2 toggles to its high level Phi2_ h, which stops the transfer of counter-charges by the transistor M2. In the course of this transfer, the potential Va changes from Vp2 to Vcomp2.

The transfer step therefore involves the transfer of a quantity—Q0 of counter-charges that is equal to C×(Vp2−Vcomp2). Thus, in the course of the injection of counter-charges, the variation in potential at the charge point A is limited by fixed and controlled potentials. In relation to the counter-charge injection circuit 14 in FIG. 1, the injection circuit 41 makes the quantity—Q0 dependent no longer on the potentials of the channels of the transistors M1 and M2 but rather on potentials that are external to the transistors M1 and M2. More precisely, the quantity—Q0 is dependent no longer on the variation of the potential Va between the internal potentials Vg1s and Phi2s_b but rather on the variation in the potential Vb (which is identical to the variation in Va) between the potentials Vp2 and Vcomp2, which can be determined precisely, for example by applying these potentials through voltage sources. Of course, for the quantity of counter-charges that are injected to be dependent neither on the internal potential Vg1s nor on the internal potential Phi2s_b, it is necessary to choose the potentials Vp2, Vcomp2, Phi2_b and Vg1 such that (Vp2−Vcomp2)<(Vg1s−Phi2s_b). In the aim of limiting the number of potentials that are necessary, it is possible to choose Vp2=Phi2s_b and Vcomp2=Vg1s if the comparator 425 is slightly unbalanced, that is to say if the toggling threshold is slightly higher than Vcomp2.

In the prior art (FIG. 3), the counter-charge is dependent on the difference in the internal potentials of M1 and M2. It is therefore important that these two transistors are as closely matched as possible (proximity, same dimensions, same system of skimming operation) in order to eliminate thermal or technological variations as much as possible.

In the invention, however, the voltage from the end of precharge for A is stored when the switch 423 is off, and the only concern then is the variation in this voltage. There is therefore more freedom for precharging A. In particular, the precharge transistor M1 can be produced by an MOS transistor of relatively large dimensions, the capacitance thereof not influencing the precharge step.

In order to allow the production of counter-charge packets for which the quantity—Q0 is relatively small, the follower 421 is preferably slightly capacitive at its input, that is to say by a few femtofarads. It is therefore subject to rts noise, which translates into a variation in the offset of said follower (potential difference between the input and the output of the follower). However, the offset is eliminated by the capacitor 422, the variation in the potential Va always remaining identical to the variation in the potential Vb. On the other hand, the variation in the offset brings about a difference between the variations in Va and Vb. However, this difference remains only during the generation of the counter-charge packet, in the course of which the variation in the offset occurs. In other words, if the offset of the follower 421 varies once in the course of one out of N injections, only one counter-charge packet undergoes a deterioration in its quantity—Q0. It can likewise be noted that, since the comparator 425 is driven by a follower via a capacitor, that is to say by an assembly with a relatively low AC output impedance, it does not need to be very slightly capacitive at its input. It can thus be produced by FET transistors that have dimensions sufficiently large for it not to have any rts noise. So as to transmit the variation in the potential Va to the potential Vb with the minimum of loss, the capacitor 422 preferably has a capacitance C2 that is high in relation to the parasitic capacitances existing at the point B. Typically, the capacitor 422 has a capacitance C2 of between a few tens of fF and a few hundreds of fF. Finally, it can be pointed out that the follower 421 could be replaced by a linear amplifier, with the potentials Vp2 and Vcomp2 then needing to be adapted on the basis of the amplification gain.

Figure 5:
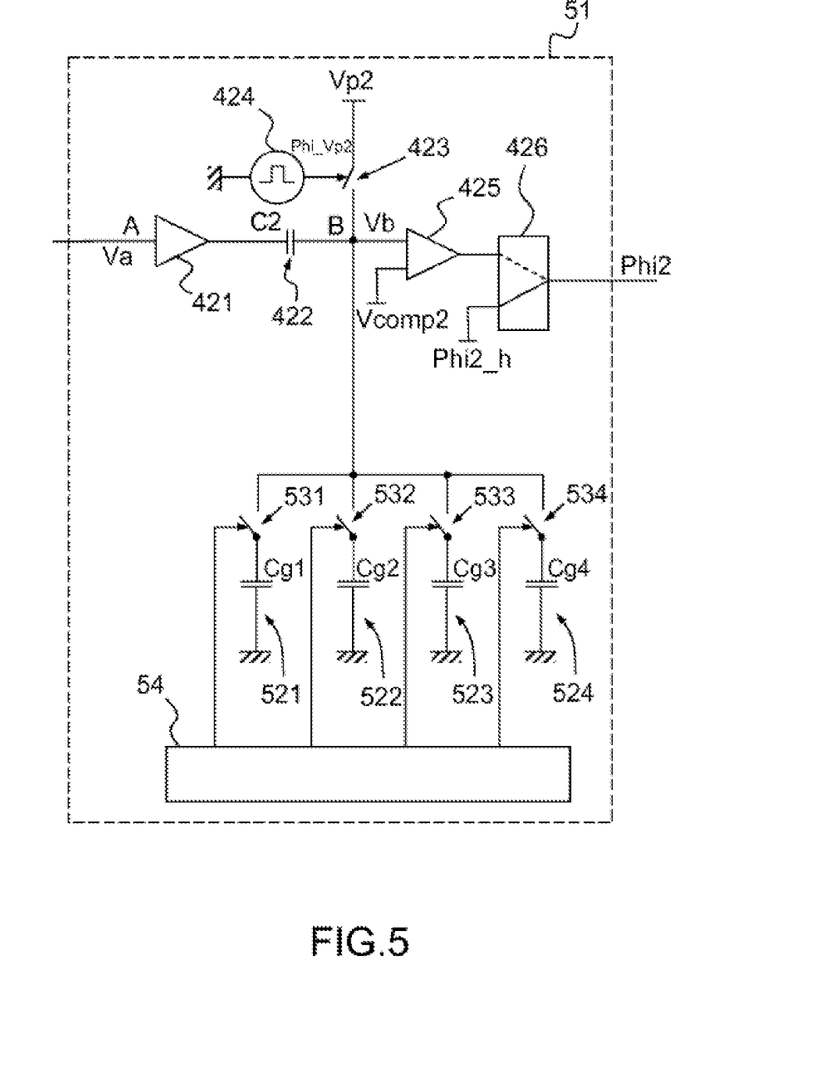
FIG. 5 shows the circuit diagram for a variant embodiment of a regulation circuit in the pixel from FIG. 4.

FIG. 5 shows the circuit diagram for a variant embodiment of the regulation circuit 42 shown in FIG. 4. This variant allows pixel-by-pixel adjustment of the quantity—Q0 of counter-charges that are injected. Such an adjustment may turn out to be necessary when the quantity of counter-charges is very small, for example a few hundred holes. The capacitor 143 of each injection circuit then needs to have a very low capacitance C, in the order of one femtofarad. By way of example, this capacitance C is obtained by the parasitic capacitances of the transistors M1 and M2. In any event, the capacitance C may undergo large variations from one pixel to another, and it is therefore desirable to be able to have a means for adjusting the quantity—Q0 of counter-charges from one pixel to another. According to the variant embodiment in FIG. 5, this adjustment is made indirectly by means for modifying the transmission gain between the variation in the potential Va and the variation in the potential Vb. In other words, the aim is to modulate, for each pixel, the value of the potential at the charge point A before the injection of the counter-charges, that is to say the value of one of the terminals defined above. It would likewise be possible to adjust the value Vcomp pixel by pixel. The regulation circuit 51 in FIG. 5 has, besides the regulation circuit 42 from FIG. 4, a set of capacitors 521, 522, 523 and 524, of capacitances Cg1, Cg2, Cg3 and Cg4, respectively, a controlled switch 531, 532, 533 or 534 for each capacitor, and control means 54 for the switches. In FIG. 5, a set of four capacitors is considered. Nevertheless, a number of capacitors may be considered, depending on the desired degree of precision. Each capacitor 52i, where i takes integer values between 1 and 4 in this case, is connected between a fixed voltage source, for example ground, and the associated switch 53i. Moreover, each switch 53i is connected to the point B. The control means 54 comprise a memory that stores a memory weight for each switch, for example. Each memory weight indicates whether the switch 53i needs to be turned on or off. When the switches 53i are turned on, the capacitors 52i are connected in parallel and their capacitances Cgi are added. The sum of the capacitances Cgi connected to the point B is denoted by Cadd. It is noted that Cadd may likewise have parasitic capacitances. The transmission gain between the variation in the potential Va and that in the potential Vb is then equal to the capacitive ratio C2/(C2+Cadd). The values of the capacitances Cgi may differ from one another. By way of example, it is possible for them to be chosen in a progression in powers of two (1, 2, 4, 8, etc.), so as to be able to choose all multiples of the lowest capacitance Cgi using a binary code that is stored in the control means 54.

Thus, during each injection, the potential at the charge point A varies between two controlled terminals, the value of one of these terminals being able to be adjusted pixel by pixel. Thus, the quantity of counter-charges that is injected upon each injection can be modulated from one pixel to another, on the basis of the capacitance C.

Figure 6:
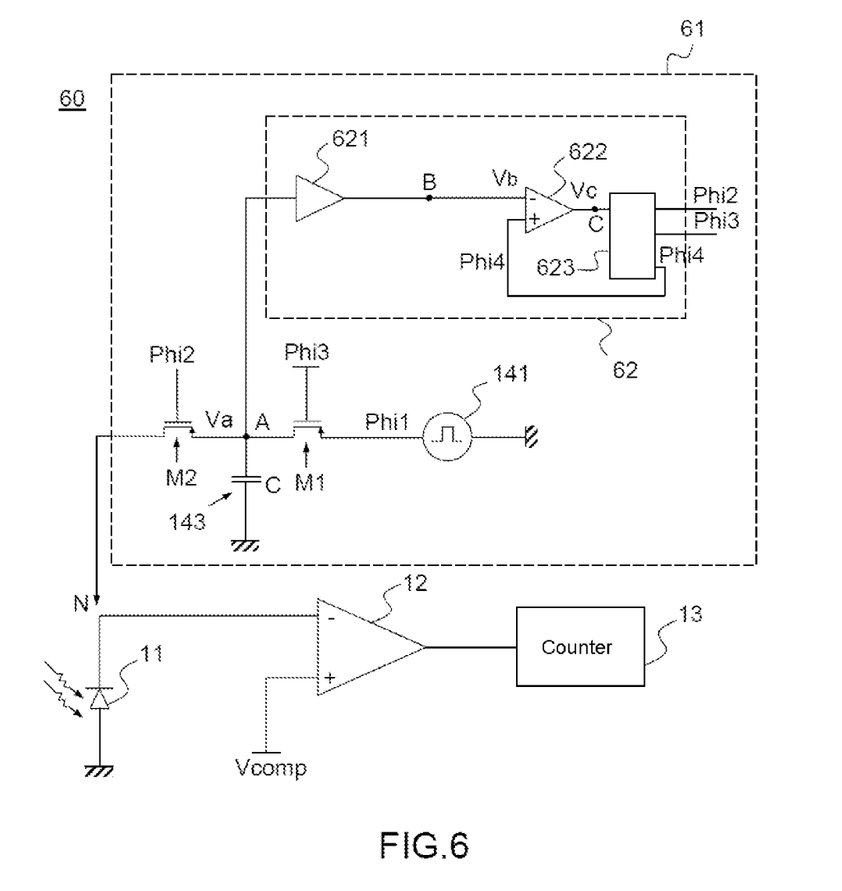
FIG. 6 shows the circuit diagram for a second example of a pixel according to the invention.

FIG. 6 shows the circuit diagram for a second example of a pixel 60 according to the invention. The pixel 60 likewise comprises a photodiode 11, a threshold capacitor 12, a counter 13 and a counter-charge injection circuit 61 that are connected together as for the pixel 40 in FIG. 4. Structurally, the counter-charge injection circuit 61 differs from the injection circuit 41 essentially by virtue of its regulation circuit 62. It likewise differs in that the gate of the transistor M1 is biased no longer to a fixed potential but rather by a control potential Phi3 that is generated by the regulation circuit 62. Said circuit 62 still receives the potential Va from the point A at its input and delivers the control potential Phi2 and the control potential Phi3 at its output. It may comprise a follower 621, a threshold comparator 62 and a sequential logic unit 623. The follower 621 receives the potential Va at an input. This follower 621 is optional. It allows a small capacitance to be maintained at the point A, while supplying power to the comparator 622, which is useful when the input capacitance of the latter is high. An output of the follower 621, forming the point B, image of the point A, of potential Vb, is connected to a negative input of the comparator 622. An output of the comparator 622, forming a reference point C of potential Vc, is connected to an input of the logic unit 623. The logic unit 623 delivers the control potential Phi2 and the control potential Phi3 at its output, biasing the gate of the transistor M2 and the gate of the transistor M3, respectively. The control potentials Phi2 and Phi3 can take a high value, Phi2__h and Phi3h, respectively, and a low value, Phi2__b and Phi3__b, respectively. Moreover, the logic unit 623 delivers a comparison potential Phi4 that is injected onto a positive input of the comparator 622. The potential Phi4 can take a high value Phi4__h and a low value Phi4__b. In this counter-charge injection circuit 61, the control circuit, not shown, the input of which receives the toggling information of the threshold comparator 12, can control the voltage source 141 and the logic unit 623.

Figure 7A:
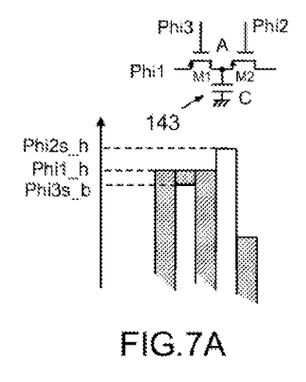
FIGS. 7A to 7E illustrate—by means of a representation similar to FIGS. 2A to 2E—the principle of operation of the counter-charge injection circuit in the pixel from FIG. 6.
Figure 7B:
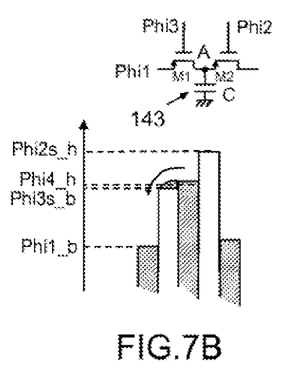
Figure 7C:
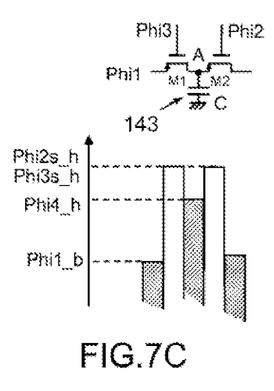
Figure 7D:
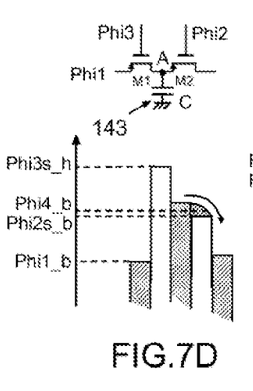
Figure 7E:
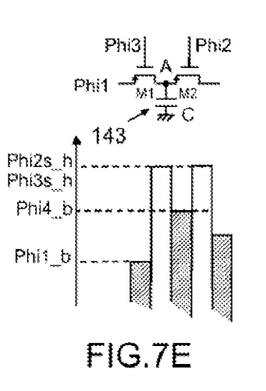
Figure 8:
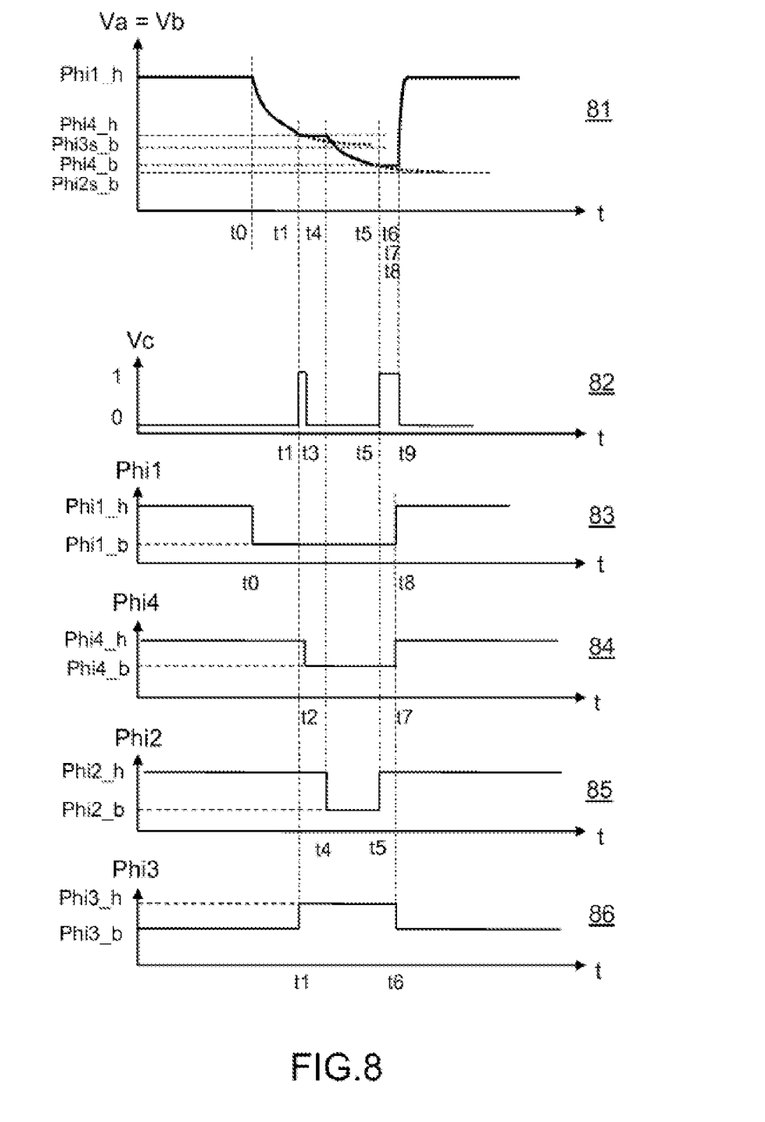
FIG. 8 shows, by means of timing diagrams, the principle of operation of the counter-charge injection circuit in the pixel from FIG. 6.

FIGS. 7A to 7E illustrate, similarly to FIGS. 2A to 2E, the principle of operation of the counter-charge injection circuit 61. The columns, from left to right, show the potential Phi1, the internal potential Phi3s of the transistor M1, the potential Vb at the point B, the internal potential Phi2s of the transistor M2 and the potential on the drain of the transistor M2, respectively. FIG. 8 shows this same operation in the form of timing diagrams. A first timing diagram 81 shows the potential Vb at the point B. For the purpose of simplification, it is supposed that the follower 621 is perfect, that is to say that the potential Vb at the point B is exactly equal to the potential Va at the point A. The counter-charge injection circuit 61 can nevertheless operate with the same precision if the follower introduces an offset voltage (offset) or if it is replaced by a voltage amplifier operating in the linear mode. Timing diagrams 82, 83, 84, 85 and 86 show the potential Vc at the point C, the potential Phi1, the potential Phi4, the potential Phi2 and the potential Phi3, respectively. FIG. 7A shows the counter-charge injection circuit 61 at the conclusion of the precharge step. By way of example, this step is produced at the end of the preceding injection. The potential Phi1 is at the high level Phi1__h, the potential Phi2 is at the high level Phi2__h (and therefore Phi2s is at the high level Phi2s__h), the potential Phi3 is at the low level Phi3__b (and therefore Phi3s is at the low level Phi3s__b) and the potential Phi4 is at the high level Phi4__h. The potentials Phi1__h, Phi2__h and Phi3__b are determined so that Phi1__h is higher than Phi3s__b and lower than Phi2s__h. At the end of the precharge step, the potential Va (and therefore the potential Vb) is thus stabilized at the potential Phi1__h. FIG. 7B shows the injection circuit 61 during the skimming step. By way of example, this step is triggered by the control circuit following the toggling of the comparator 12. It begins at an instant t0, when the voltage source 141 changes the potential Phi1 to the low level Phi1__b. Since the potential Phi1__b is lower than the potential Phi3s__b, the transistor M1 is on and evacuates the excess charges from the capacitor 143 to the voltage source 141, bringing about a decrease in the potentials Va and Vb to the asymptotic value Phi3s__b. The potential Phi4__h is chosen so that the potential Vb reaches this value Phi4__h before the potential Va reaches the potential Phi3s__b. In the present case, in which the potentials Va and Vb are equal, it is sufficient to choose Phi4__h to be higher than Phi3s__b. When the potential Vb reaches the value Phi4__h, at an instant t1, the comparator 622 toggles. By way of example, the potential Vc changes from a low state "0" to a high state "1". The logic unit 623 then changes the potential Phi3 to the high level Phi3__h, which blocks the skimming, as shown in FIG. 7C. Immediately after the instant t1, at an instant t2, the logic unit 623 changes the potential Phi4 to the low level Phi4__b. Since the potential Phi4__b is lower than the potential Vb, substantially equal to the potential Phi4__h at the instant t2, the comparator 622 toggles again at an instant t3, with the potential Vc changing to the low state again. At an instant t4, after the instant t3, the logic unit 623 changes the potential Phi2 to the low level Phi2__b. The potential Phi2__b is determined so that the potential Phi2s__b is lower than the potential Phi4__h. The transistor M2 then conducts the charges from the capacitor 143 to the photodiode 11. This transfer step is shown by FIG. 7D. During this step, the potentials Va and Vb tend toward the asymptotic value Phi2s__b. The potential Phi4__b is chosen so that the potential Vb reaches this value Phi4__b before the potential Va reaches the potential Phi2s__b. In the present case, in which the potentials Va and Vb are equal, it is sufficient to choose Phi4b to be higher than Phi2s__b. When the potential Vb reaches the value Phi4__b, at an instant t5, the comparator 622 toggles and changes the potential Vc to the high state. The logic unit 623 then changes the potential Phi2 to the high level Phi2__h, which blocks the transfer, as shown in FIG. 7E. At the conclusion of the transfer step, a precharge step can be produced for the following injection. In this step, the logic unit 623 changes the potential Phi3 to the low level Phi3__b at an instant t6; it changes the potential Phi4 to the high level Phi4__h at an instant t7; and the voltage source 141 changes the potential Phi1 to the high level Phi1__h at an instant t8. Consequently, the potential Vb stabilizes at the level Phi1__h. Since this potential Phi1__h is higher than the potential Phi4__h, the comparator 622 toggles again at an instant t9, with the potential Vc changing to the low state again. It is noted that the various operations of the precharge step can be produced in any order. The instants t6, t7 and t8 are concomitant, for example. For example, the precharge step can be produced at the start or at the end of each injection equally. In the first case, the precharge step is useful for the injection in progress. In the second case, it is useful for the following injection. Each transfer involves the injection of a quantity—Q0 of counter-charges that is equal to C×(Phi4__h−Phi4b). The quantity—Q0 is therefore independent of the internal potentials of the transistors M1 and M2. Moreover, it is independent of the offsets of the follower 621 and of the comparator 622, provided that these offsets are stable during the skimming and transfer steps. If an offset varies during these steps, only the injection during which this variation occurs is impaired, and not the following injections.

In the regulation circuit 62 in FIG. 6, the follower 621 can be replaced by an amplifier of gain G. The quantity—Q0 then becomes 1/G×C×(Phi4__h−Phi4b). The potentials Phi4__h and Phi4__b can easily be adjusted accordingly.

Thus, in the course of counter-charge injection, the variation in potential at the charge point A is limited by fixed and controlled potentials.

The invention claimed is:

1. An electronic circuit for a radiation detector, the electronic circuit comprising:
   a comparator, a first input of the comparator receives a predetermined threshold potential and a second input of the comparator is connected to an integration node that stores electrical charges generated by a photosensitive element upon reception of a photon radiation, wherein the electrical charges bring about a variation in a detection potential on the integration node, a counter connected to an output of the comparator to count transgressions of the predetermined threshold potential by the detection potential, and a counter-charge injection circuit allowing the electrical charges to be counterbalanced, the counter-charge injection circuit comprising:

a capacitor storing electrical counter-charges, a transfer transistor that can be turned on to transfer counter-charges from a terminal of the capacitor to the integration node whenever the comparator toggles, wherein the terminal of the capacitor forms a node of the counter-charge injection circuit, wherein the transfer of the counter-charges bring about a variation in a potential at the node of the counter-charge injection circuit, and a regulation circuit for controlling the transfer transistor, wherein the regulation circuit comprises means for turning on the transfer transistor when the potential at the node of the counter-charge injection circuit is between two predetermined potentials that are independent of the transfer transistor.

2. The electronic circuit as claimed in claim 1, wherein the regulation circuit further comprises means for generating a reference potential at a point at which a variation is representative of the variation in the potential at the node of the counter-charge injection circuit, wherein the means for controlling the transfer transistor turns on the transfer transistor when the reference potential is between a first and second predetermined potentials that are independent of the transfer transistor.

3. The electronic circuit as claimed in claim 2, wherein the regulation circuit further comprises means for forcing the reference potential to the first predetermined potential, wherein the regulation circuit for controlling the transfer transistor has a second comparator, a first input of the second comparator receives the reference potential, a second input of the second comparator receives the second predetermined potential, and an output of the second comparator delivers a control signal based on a result of a comparison between the reference potential and the second predetermined potential, wherein the control signal allows the transfer transistor to be turned on.

4. The electronic circuit as claimed in claim 3, wherein the means for forcing the reference potential to the first predetermined potential comprise a controlled switch connected between a point that has a potential used as the reference potential and a voltage source that provides the first predetermined potential.

5. The electronic circuit as claimed in claim 2, wherein the means for generating a reference potential comprise a linear amplifier, an input of the linear amplifier is connected to the capacitor, and a second capacitor connected between an output of the linear amplifier and a point that has a potential used as the reference potential.

6. The electronic circuit as claimed in claim 5, wherein the regulation circuit further comprises a set of capacitors, a controlled switch for each capacitor of the set of capacitors, and control means for the controlled switches, wherein each capacitor of the set of capacitors is connected between a fixed voltage source and an associated controlled switch, each controlled switch is further connected to a point that has a potential used as the reference potential.

7. The electronic circuit as claimed in claim 2, wherein the counter-charge injection circuit further comprises a precharge transistor that can be turned on to transfer counter-charges to the capacitor and outside the capacitor, wherein transfer of the counter-charges brings about a variation in voltage at terminals of the capacitor, and wherein the regulation circuit further comprises means for turning on the precharge transistor to take the reference potential to the first predetermined potential.

8. The electronic circuit as claimed in claim 7, wherein the regulation circuit for controlling the transistors further comprises a second comparator and a logic unit, wherein the second comparator receives the reference potential on a first input and a comparison potential on a second input, wherein the comparison potential takes either a value of the first predetermined potential or a value of the second predetermined potential, wherein the logic unit receives an output of the second comparator at an input and delivers a comparison potential, a first control signal controls the transfer transistor and a second control signal controls the precharge transistor.

9. The electronic circuit as claimed in claim 8, wherein the means for generating a reference potential comprise a linear amplifier, wherein an input of the linear amplifier is connected to the capacitor, and wherein an output of the linear amplifier delivers the reference potential.

10. The electronic circuit as claimed in claim 1, wherein the counter-charge injection circuit further comprises a precharge transistor of field-effect-transistor type, a gate of the precharge transistor is biased to a fixed potential, the precharge transistor allows counter-charges to be transferred to the capacitor and outside the capacitor, and wherein transfer of the counter-charges brings about a variation in voltage at terminals of the capacitor.

11. A radiation detector having a photosensitive element that generates electrical charges on the integration node upon reception of a photon radiation, and the electrical circuit as claimed in claim 1, wherein the second input of the comparator is connected to the integration node.

* * * * *